United States Patent [19]
Allen et al.

[11] Patent Number: 5,010,024

[45] Date of Patent: Apr. 23, 1991

[54] PASSIVATION FOR INTEGRATED CIRCUIT STRUCTURES

[75] Inventors: Bert L. Allen, Los Altos; Peter S. Gwozdz, Cupertino, both of Calif.; Thomas R. Bowers, Austin, Tex.

[73] Assignee: Advanced Micro Devices, Inc., Sunnyvale, Calif.

[21] Appl. No.: 353,169

[22] Filed: May 15, 1989

Related U.S. Application Data

[62] Division of Ser. No. 21,828, Mar. 4, 1987, abandoned.

[51] Int. Cl.$^5$ .................. H01L 21/425; H01L 21/441
[52] U.S. Cl. ........................................ 437/24; 437/52; 437/195
[58] Field of Search ...................... 357/91, 52; 437/24, 437/52, 195

[56] References Cited

U.S. PATENT DOCUMENTS

| | | | |
|---|---|---|---|
| 3,660,819 | 5/1972 | Frohman-Bentchkowsky | 317/235 R |
| 4,203,158 | 5/1980 | Frohman-Bentchkowsky | 365/185 |
| 4,223,048 | 9/1980 | Engle, Jr. | 427/39 |
| 4,393,479 | 7/1983 | Du et al. | 365/218 |
| 4,406,053 | 9/1983 | Takasaki et al. | 29/588 |
| 4,446,194 | 5/1984 | Candelaria | 437/195 |
| 4,448,400 | 5/1984 | Harari | 365/185 |
| 4,516,313 | 5/1985 | Turi et al. | 29/571 |
| 4,532,022 | 7/1985 | Takasaki | 204/192 D |
| 4,618,541 | 10/1986 | Forouhi | 428/688 |

FOREIGN PATENT DOCUMENTS 0056635  4/1980  Japan .................................. 437/24

OTHER PUBLICATIONS

Samuelson, G. M. et al., "The Correlations Between Physical and Electrical Properties of PECVO SiN with their Composition Ratios", Journal of the Electrochemical Society: Solid State Science and Technology, vol. 129, No. 8, Aug. 1982, pp. 1773–1778.

Alexander, K. et al., "Moisture Resistive, UV Transmissive Passivation for Plastic Encapsulated EPROM Devices", IEEE 22nd Annual proceedings of the International Reliability Physics Symposium, Apr. 3–5, 1984, pp. 218–222.

"Controlling Stress in Oxy-Nitride Films", ASM America News Letter, vol. 1, No. 2, Dec. 1985, pp. 1–3.

Sinha, A. K. et al., "Reactive Plasma Deposited SiN Films for MOS-LSI Passivation", Journal of the Electrochemical Society: Solid State Science and Technology, vol. 125, No. 4, Apr. 1978, pp. 601–608.

Yue, J. T. et al., "Stress Induced Voids in Aluminum Interconnects During IC Processing", IEEE 23rd International Reliability Physics Symposium, 1985, pp. 126–137.

(List continued on next page.)

Primary Examiner—Olik Chaudhuri
Assistant Examiner—Ourmazd S. Ojan
Attorney, Agent, or Firm—John P. Taylor

[57] ABSTRACT

A method is described for producing an integrated circuit structure, including EPROMS, having excellent resistance to penetration by moisture and ion contaminants and a substantial absence of voids in an underlying metal layer in the structure, and, in the case of EPROMS, maintaining sufficient UV light transmissity to permit erasure which comprises stress relieving the underlying metal layer from stresses induced by the compressive stress of a silicon nitride encapsulating layer to inhibit the formation of voids therein by implanting the metal layer with ions to change the grain structure adjacent the surface of the metal layer; forming an insulating intermediate layer between said the layer and the silicon nitride layer selected from the class consisting of an oxide of silicon and silicon oxynitride having a compressive/tensile stress which sufficiently compensates for the compressive stress of the silicon nitride layer; and controlling the compressive stress in the silicon nitride layer to provide resistance to moisture and ion penetration superior to silicon dioxide or silicon oxynitride layers of similar thickness while inhibiting formation of voids in the metal layer.

30 Claims, 2 Drawing Sheets

OTHER PUBLICATIONS

Frohman-Bentchkowsky, D., "FAMOS-A New Semiconductor Charge Storage Device", *Solid State Electronics*, vol. 17, 1974, pp. 517-529.

Katznelson, R. et al., "An Erase Model for FAMOS EPROM Devices", *IEEE Transactions on Electron Devices*, vol. ED-27, No. 9, Sep. 1980, pp. 1744-1752.

Nagy, T. E. et al., "Physical and Electrical Properties of Plasma Deposited Silicon Nitride Films", *ECS Proceedings of the Symposium on Silicon Nitride Thin Insulating Films*, vol. 83-8, 1983, pp. 167-176.

Rand, M. J. et al., "Optical Absorption as a Control Test for Plasma Silicon Nitride Deposition", *Journal of the Electrochemical Society: Solid-State and Technology*, vol. 125, No. 1, Jan., 1978, pp. 99-101.

PASSIVATION FOR INTEGRATED CIRCUIT STRUCTURES

CROSS-REFERENCE TO RELATED APPLICATIONS

The application is a division of U.S. patent application Ser. No. 021,828, filed Mar. 4, 1987, now abandoned.

BACKGROUND OF THE INVENTION

1. Field of the Invention

This invention relates to integrated circuit structures. More particularly, this invention relates to improved passivation of integrated circuit structures, including the EPROM type, to mitigate or eliminate the formation of voids in underlying metal layers.

2. Description of the Related Art

In the construction of integrated circuit devices, a topside or "passivation" layer of a dielectric material is conventionally provided over the underlying layers comprising the integrated circuit structure. This layer, in addition to functioning as an insulation layer, acts to protect the underlying structure from moisture and ion contamination which can damage or destroy the structure by causing corrosion and electrical shorts.

The passivation material, then, should be relatively impervious to moisture and other contaminants. Silicon nitride (principally $Si_3N_4$) is known as a satisfactory insulation material for forming a passivation or encapsulation layer for an integrated circuit structure which provides excellent protection from moisture and ion contamination.

The use of silicon nitride as such a passivation material is discussed in various publications and patents such as M. J. Rand et al in "Optical Absorption as a Control Test for Plasma Silicon Nitride Deposition", J. Electrochemical Soc., Solid-State Science and Technology, Vol. 125, No. 1, January 1978, at pp. 99–101; A. K. Sinha et al in "Reactive Plasma Deposited SiN Films for MOS-LSI Passivation", J. Electrochemical Soc., Solid-State Science and Technology, Vol. 125, No. 4, April 1978, at pp. 601–608; G. M. Samuelson et al in "The Correlations Between Physical and Electrical Properties of PECVD SiN with Their Composition Ratios", J. Electrochemical Soc., Solid-State Science and Technology, Vol. 129, No. 8, August 1982, at pp. 1773–1778; T. E. Nagy et al in "Physical and Electrical Properties of Plasma Deposited Silicon Nitride Films", ECS Proceedings of the Symposium on Silicon Nitride Thin Insulating Films, Vol. 83-8, 1983, pp. 167–176; Engle U.S. Pat. No. 4,223,048; Takasaki U.S. Pat. No. 4,406,053; Harari U.S. Pat. No. 4,448,400; and Turi et al U.S. Pat. No. 4,516,313.

The construction of non-volatile read-only memory (ROM) integrated circuit structures in which a charge may be semi-permanently stored, yet erased when desired, known as erasable programmable read only memories (EPROMS) is described in various publications and patents including D. Frohman-Bentchkowsky in "FAMOS-A New Semiconductor Charge Storage Device", Solid-State Electronics, Vol. 17, 1974, pp. 517–529; R. D. Katznelson et al in "An Erase Model for FAMOS EPROM Devices". IEEE Transactions on Electron Devices, Vol. ED-27, no. 9, September, 1980, at pp. 1744–1752; and in Du et al U.S. Pat. No. 4,393,479.

Such devices store a charge on a floating gate of an MOS type device which charge may be removed (to erase the device) by exposure of the device to UV light which passes through the encapsulant or passivation layer to reach the charge on the floating gate.

Unfortunately, however, conventional silicon nitride passivation or encapsulation layers, which might otherwise be used in such structures, are relatively opaque to UV light and do not allow a sufficient amount of energy at such wavelengths to reach the charge on the floating gate.

Thus, despite the known superior properties of silicon nitride passivation layers for encapsulating an integrated circuit structure to protect it against moisture penetration and ionic contamination, it has been conventional in the prior art to employ other, less satisfactory, encapsulants such as silicon oxide ($SiO_2$) and silicon oxynitride materials since they will permit transmission of sufficient electromagnetic radiation of UV wavelength therethrough to permit removal of the charge on the floating gate, i.e., permit erasure of the device.

The use of such alternative passivation layers are discussed in publications and patents such as K. Alexander et al in "Moisture Resistive, U.V. Transmissive Passivation for Plastic Encapsulated EPROM Devices", IEEE 22nd Annual Proceedings of the International Reliability Physics Symposium, Apr. 3–5, 1984, Los Vegas, at pp. 218–222; and Takasaki et al U.S. Pat. No. 4,532,022 which discuss the use of silicon oxynitride films for EPROMS and Frohman-Bentchkowsky U.S. Pat. No. 3,660,819 which describes the use of $SiO_2$ over the floating gate of an EPROM device.

However, it has recently been discovered that it is possible to construct an EPROM structure using a particularly formed silicon nitride passivation layer which will provide the superior encapsulation properties of silicon nitride, yet transmit sufficient UV radiation therethrough to provide the required erasure properties as well. The method for forming such a UV-transparent layer of silicon nitride is described and claimed in Forouhi et al U.S. Pat. No. 4,618,541, assigned to the assignee of this invention, in which one of the present inventors is a named coinventor. An erasable programmable read only memory integrated circuit device having such a UV-transparent silicon nitride passivation layer thereon is described and claimed in copending U.S. patent application Ser. No. 697,364 now issued as U.S. Pat. No. 4,665,426, on May 12, 1987, which is also assigned to the assignee of this invention, and in which one of the present inventors also is a named coinventor.

While such UV light-transparent silicon nitride passivation layers have been found to perform satisfactorily in both encapsulating the integrated circuit device and permitting erasure with UV light, such silicon nitride passivation layers may be formed in an excessively compressive stress mode which, in turn, can result in the formation of undesirable voids in the underlying metal layer, e.g., an aluminum layer, used in the formation of the erasable gate structure beneath the silicon nitride passivation layer. Creation of such voids is believed to be the result of migration of metal atoms in the stressed metal layer.

The creation of voids in aluminum, apparently induced by an overlying silicon nitride passivation layer in conventional integrated circuit structures wherein the silicon nitride layer is not transparent to UV energy, was earlier discussed by J. T. Yue et al in "Stress Induced Voids in Aluminum Interconnects During IC Processing", IEEE 23nd Annual Proceedings of the International Reliability Physics Symposium, 1985, at pp. 126-137.

As pointed out in this article, creation of such voids in the metal wiring can result in failure of the integrated circuit structure. It is, therefore, important to be able to construct an integrated circuit structure which not only will provide the desired degree of protection against moisture and ion contamination penetration, but also inhibit the formation of voids in the underlying metal wiring of the structure as well.

SUMMARY OF THE INVENTION

It is, therefore, an object of this invention to provide a method for forming an integrated circuit structure having a silicon nitride passivation layer thereon to protect the device from moisture and ion contamination wherein void formation in the underlying metal layer will be minimized or substantially eliminated.

It is another object of this invention to provide a method for forming an integrated circuit structure having a silicon nitride passivation layer thereon to protect the device from moisture and ion contamination, including an erasable programmable read only memory device (EPROM) wherein the silicon nitride passivation layer thereon is also UV light transparent, wherein void formation in the underlying metal layer will be minimized or substantially eliminated by controlling the amount of compressive stress formed in the transparent silicon nitride layer by controlling the reaction parameters, including silane and ammonia gas flows, pressure, power, and duty cycle of the plasma deposition reactor, used in forming the silicon nitride layer.

It is yet another object of this invention to provide a method for forming an integrated circuit structure having a silicon nitride passivation layer thereon to protect the device from moisture and ion contamination, including an erasable programmable read only memory device (EPROM) wherein the silicon nitride passivation layer thereon is also UV light transparent, wherein void formation in the underlying metal layer will be minimized or substantially eliminated by treating the underlying aluminum layer to alter the grain structure in a manner which will reduce or eliminate the formation of voids in the metal layer.

It is a further object of this invention to provide a method for forming an integrated circuit structure having a silicon nitride passivation layer thereon to protect the device from moisture and ion contamination, including an erasable programmable read only memory device (EPROM) wherein the silicon nitride passivation layer thereon is also UV light transparent, wherein stress-induced void formation in the underlying metal layer will be minimized or substantially eliminated by providing an intermediate layer of a material which will mitigate the transmission of compressive stress from said silicon nitride passivation layer to said underlying metal layer.

These and other objects of the invention will be apparent from the following description and accompanying drawings.

DETAILED DESCRIPTION OF THE INVENTION

Figure 1:
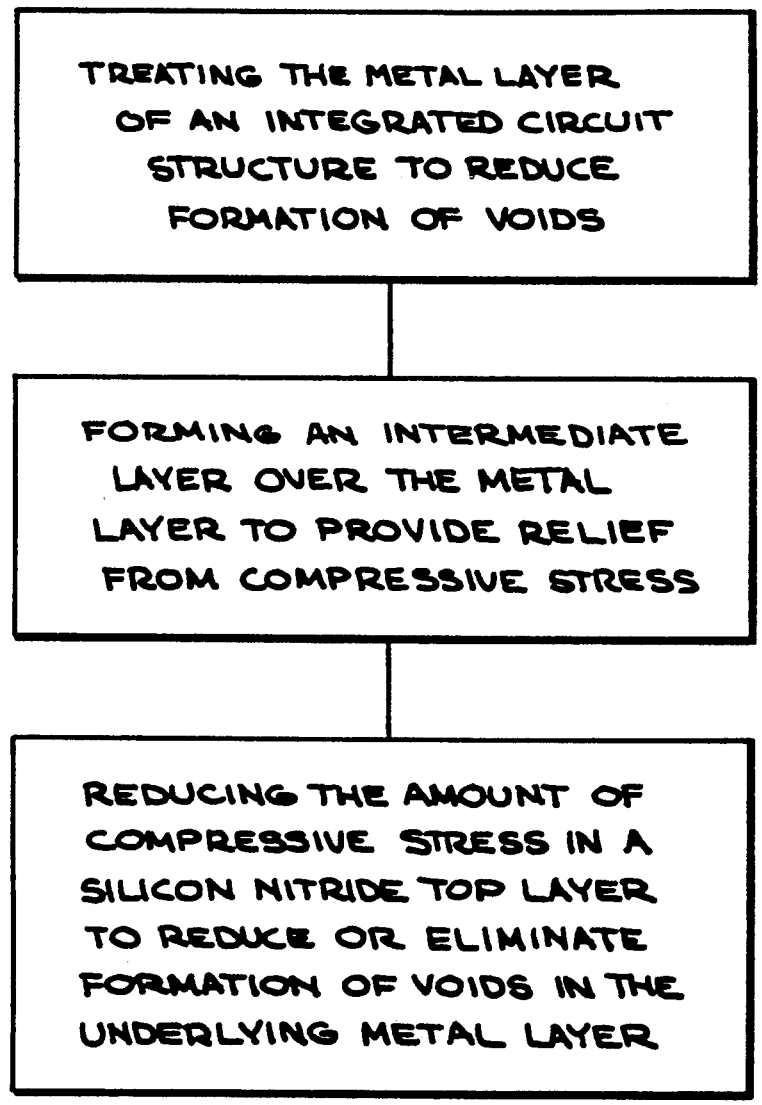
FIG. 1 is a flowsheet illustrating the process of the invention.

The invention provides an improved method for encapsulating an integrated circuit structure wherein the deleterious effects of void formation in the underlying metal layer, apparently caused by metal atom migration induced by compressive stresses transmitted to the metal layer from a silicon nitride encapsulation layer, are mitigrated or substantially eliminated.

In a preferred embodiment, the invention is particularly directed to the formation of an erasable programmable read only memory integrated circuit device with a passivation layer of a substantially UV transparent silicon nitride material wherein the deleterious formation of voids in the underlying metal layer induced by compressive stresses transmitted to the metal layer from the silicon nitride layer are mitigated or substantially eliminated.

The method of the invention actually comprises three aspects: (11) treatment of the metal layer to reduce the effects of the transmission of the compressive stress from the silicon nitride layer to the metal layer by ion implantation of the metal layer to alter the grain size; (2) provision of an intermediate layer of a material, preferably a UV light transparent material wherein the compressive/tensile stress of the intermediate layer may be adjusted to compensate for the compressive stress in the silicon nitride layer; and (3) control of the amount of compressive stress formed in the silicon nitride passivation layer, which also is preferably UV transparent.

While the practice of the invention preferably includes all three steps, it is within the purview of the invention to omit one of the steps if all three steps are not needed to achieve the desired sufficient stress relief to eliminate the formation of voids in the metal layer. Thus steps 1 and 2, steps 1 and 3, or steps 2 and 3 may be practiced in some instances without the remaining step to eliminate the formation of voids in the metal layer.

It should be noted, however, that there is a preferred hierarchy of treatment steps whether all three treatment steps are used or only two steps are used. As will be discussed in more detail below, this is because it is essential to the practice of this invention that the resistance to moisture and ion contamination penetration of the silicon nitride layer be preserved since this is one of the principal characteristics of the silicon nitride layer which makes it superior to other insulation layers.

Therefore, treatment of the metal layer and formation of the intermediate layer to eliminate the creation of voids in the metal layer will be preferred steps to take from a hierarchy standpoint before lowering the compressive stress on the silicon nitride layer since the high compressive stress on the silicon nitride layer contributes to the moisture and ion penetration resistance of that layer. Furthermore, when the silicon nitride layer is used as an encapsulant for an EPROM device wherein UV light transparency of the silicon nitride layer is required, decreasing compressive stress in the silicon nitride layer can result in an excess of silicon resulting in loss of UV light transparency.

The metal layer beneath the silicon nitride passivation layer may be treated by ion implantation to after the grain structure in a manner which results in a reduction in the formation of large voids therein. While the exact effect of the ion implantation on the metal structure is open to more than one explanation, it is thought that the ion implantation may act to provide a graduated prestressing of the surface compressively or it may alter the crystallinity of the metal surface by, in effect, jumbling the crystals on the metal surface to provide smaller grains which, in turn, reduce the extent of metal atom migration within the metal layer which is thought to be at least one cause of void formation.

Compressive stresses transmitted to a metal surface so treated would then either not result in the creation of void or would result in the formation of smaller voids due to the smaller grain size of the metal at or adjacent to the surface of the treated metal.

In accordance with the invention, the metal layer may be ion implanted with ions of a nonreactive element, such as argon, which will not have any deleterious effects on the metal layer. Other elements which may be ion implanted into the metal surface might, for example, include arsenic, boron, krypton, neon, or silicon. In at least some instances, ions of the same metal as the metal being treated could be used; e.g., implantation of an aluminum surface with aluminum ions.

The ions are implanted in the metal layer at an energy level of from about 40–200 kEV, preferably about 70–150 kEV when argon ions are being implanted, to provide a depth of about 15–2500 Å, preferably about 300–1200 Å, which may be attained at the 70–150 kEV energy level range. The dosage ranges from about $10^{15}$ to $10^{16}$ atoms per cm$^2$, preferably about $5 \times 10^{15}$ when argon is being implanted. The temperature during the implantation may vary in accordance with the desired time of the dosage, ranging from as low as, for example, $-10°$ C. up to as high as 300° C., typically about 100° C.

While the metal layer being ion implanted will, in most instances, comprise an aluminum metal, it will be appreciated that the term "metal layer" is intended to embrace not only pure aluminum, but aluminum base alloys as well wherein up to 20 wt. % of the aluminum base alloy may comprise one or more other alloying metals. The metal layer may also comprise other metals as well such as, for example, tantalum and/or tungsten.

In accordance with another aspect of the invention, the metal layer may be stress-relieved from compressive stress transmitted to it by the silicon nitride layer by the interposition of an intermediate layer of another material, which, in a preferred embodiment, has a controlled compressive/tensile stress therein adjusted during formation of the layer to sufficiently compensate for the compressive stress of the silicon nitride layer thereon to suppress the formation of voids in the underlying metal layer.

This intermediate layer, when used in the construction of an EPROM device, will comprise a material which is also transparent to radiation of UV wavelength so as to not interfere with the erasability of the EPROM device. However, it should be noted that the invention is not limited in application to only the construction of EPROM devices, but rather may be utilized wherever deleterious compressive stresses are transmitted from a silicon nitride layer, including conventional UV-opaque passivation layers, to an underlying metal layer resulting in the formation of voids in the metal layer.

The intermediate layer should also function as an insulation layer although it need not be completely impervious to moisture and ion contaminants since the silicon nitride, not the intermediate layer, will act as the encapsulating layer. Materials which may be utilized in the formation of this intermediate layer include silicon oxynitride and silicon oxide. Silicon oxynitride is the preferred material for use in forming the intermediate layer both from ease of formation, since the integrated circuit structure may have both the silicon oxynitride and the silicon nitride layers applied using the same apparatus, and from the known ability to control the amount of compressive/tensile stress formed in a silicon oxynitride layer.

The thickness of the intermediate layer should be sufficient to provide the desired gradient or stress compensation for the compressive stress in the overlying silicon nitride layer. Thicknesses of from about 0.2 to 3 microns, preferably about 0.5 to 1.5 microns, are satisfactory.

Figure 2:
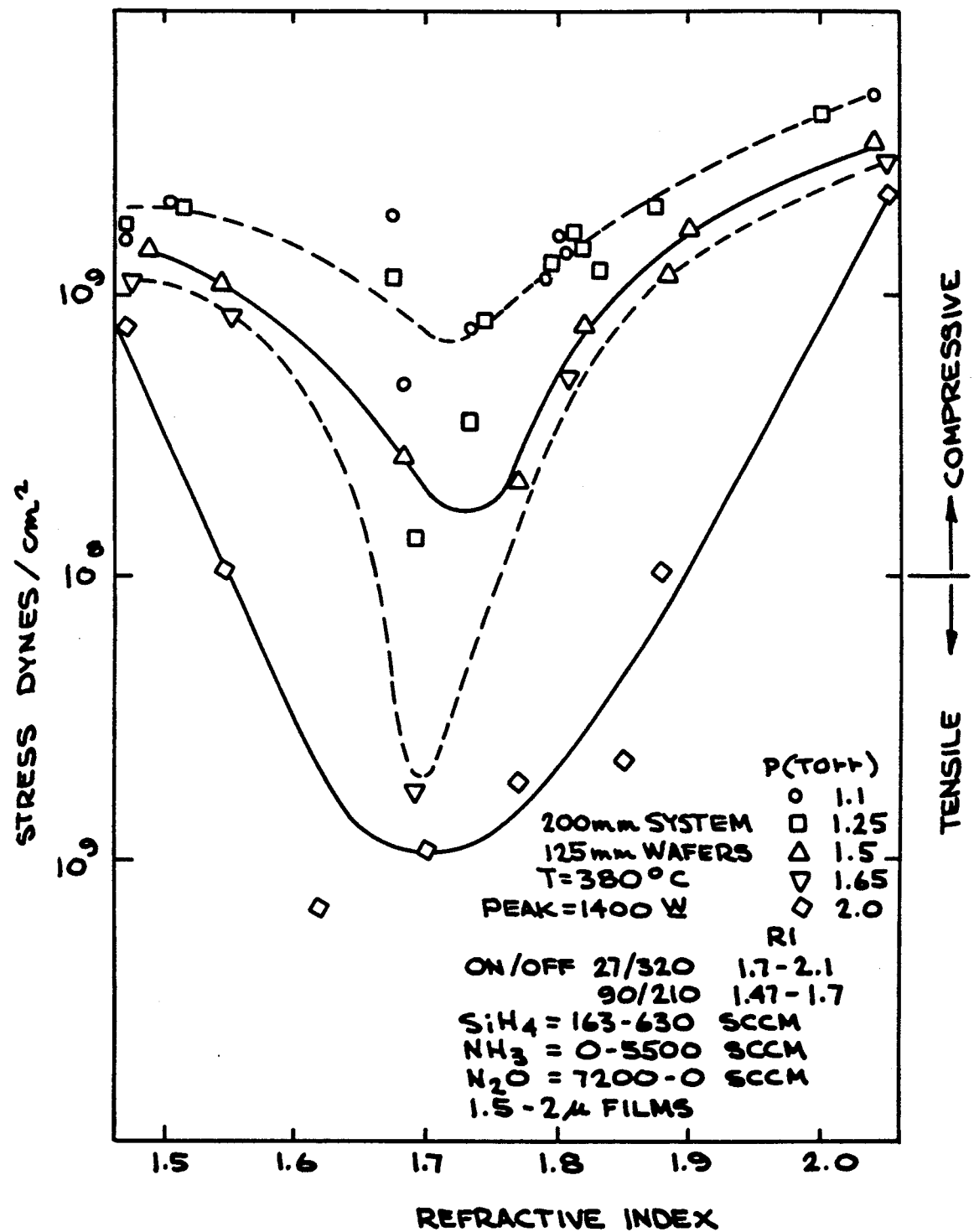
FIG. 2 is a graph showing the effects of pressure in the reactor on the compressive/tensile stress in the formation of a silicon oxynitride layer.

When silicon oxynitride comprises the intermediate layer, the amount of compressive/tensile stress contained in the layer may be adjusted during the formation of the layer by adjustment of the pressure in accordance with the parameters shown in ASM America Newsletter, Volume 1, No. 1 of December, 1985, cross-reference to which is hereby made, and the graph shown in FIG. 2. It will be seen in that graph that the use of higher pressure, i.e., greater than about 1.5 Torr, will result in a shift in the stress into a tensile stress mode. In accordance with the invention the amount of pressure used, and the resulting amount of either compressive or tensile stress formed in the intermediate layer, will be empirically determined, in part, by the amount of compressive stress formed in the subsequently formed silicon nitride layer to result in a composite layer having a compressive/tensile stress which will usually-still, be on the compressive side but will be insufficient to result in the formation of voids in the underlying metal layer.

The amount of compressive stress developed in the silicon oxynitride layer may also be lowered by adjusting other parameters in the reaction process such as by lowering the RF power in the plasma deposition reactor, e.g., from a normal 1500 watts, or lowering the duty cycle of the RF power which results in the appearance of operating at a lower power. The amount of $NO_2$ gas used may also be increased to lower the compressive stress of the silicon oxynitride layer. Other known reaction parameters which may also have an effect on the resulting compressive stress and which are interrelated to those just mentioned such as reaction time and flow rates may also be modified as well to achieve the desired compressive/tensile stress in the silicon oxynitride layer.

With respect to the extent to which the compressive stress of the intermediate layer may be lowered, the compressive/tensile stress on the intermediate layer should be adjusted as much as possible without increasing tensile stress sufficiently to result in die cracking. This, again will be an empirical determination since the amount of tensile stress which may be applied to the intermediate layer without resulting in cracking of the die will depend upon other processing steps as well as the geometry of the particular die. However, one skilled in the art will be able to readily determine, in the finished product, whether too much tensile stress has been applied to the intermediate layer resulting in cracking of the die. It should be further noted in this regard, that when the compressive stress on the subsequently formed silicon nitride layer is decreased, adjustment in the amount of tensile stress of the silicon oxynitride layer may have to be further adjusted to prevent cracking of the die.

In yet another aspect of the invention, the amount of compressive stress formed in the silicon nitride layer may also be controlled to some extent by adjustment of the pressure, i.e., by raising the pressure, during formation of the silicon nitride layer. However, while such adjustment might, on its face, appear to be the most likely way to solve the problems resulting from the compressively stressed silicon nitride layer, it must be pointed out that the ultimate reason for using a silicon nitride encapsulation or passivation layer (and for enduring the problems created thereby) is the superior moisture and ion penetration resistance of the silicon nitride layer over layers of other material such as silicon oxide and silicon oxynitride.

Modification of the silicon nitride layer to relieve stress in the metal layer is, furthermore, a particular problem in application of the silicon nitride layer as an encapsulant for EPROMS, both due to the need for preserving UV transparency (which is related to the amount of compressive stress and which, prior to the aforesaid Forouhi et al '541 patent, was a problem in itself to achieve) and preserving the resistance to moisture penetration since an EPROM structure is particularly sensitive to moisture.

This resistance to moisture and ion penetration is achieved by forming the silicon nitride layer in a compressive stress mode. While all compressive stress, therefore, could probably be alleviated or removed by adjustment of the reaction parameters, such as by providing higher pressure or lower RF power during formation of the silicon nitride film, such would be at the expense of the excellent moisture and ion penetration resistance of the silicon nitride layer which would be counter productive. Thus the amount of pressure increase during the formation of the silicon nitride layer will, in accordance with the invention, be insufficient to remove the resulting silicon nitride layer from a compressive stress mode. More particularly, the compressive stress remaining on the silicon nitride layer should not be less than about $2.5 \times 10^9$ dynes/cm$^2$, preferably $5 \times 10^9$ dynes/cm$^2$.

When a silicon nitride layer is being used as an encapsulant for an EPROM device the amount of compressive stress remaining may be further characterized as providing the UV light transparency at 2537 Å wavelength indicated by at least a 3% reflectance value as measured, for example, by a Hewlett-Packard Diode Array Spectrophotometer Model No. 8450A and preferably sufficient UV light transparency to permit erasure of the EPROM with a dual layer film (silicon oxynitride-silicon nitride) in less than one hour at 0.02-0.03 watts/cm$^2$ using, for example, a Spectronic UV light eraser.

Furthermore, control and adjustment of the reaction parameters during formation of the silicon nitride layer which affect the compressive stress developed by the layer will, in accordance with the invention, always be done in combination with either or both of the other aspects of the invention, i.e., in combination with the treatment of the metal surface or the formation of the intermediate layer or both so as to not lose the excellent moisture and ion penetration resistance properties of the silicon nitride layer.

Furthermore, as previously discussed, the hierarchy of treatments steps will favor utilizing one or both of the first two treatments prior to lowering the compressive stress on the silicon nitride layer to lower the risk of loss of some of the excellent moisture and ion penetration resistance which characterizes a silicon nitride layer under compressive stress. Therefore, before lowering the compressive stress of the silicon nitride layer, at least one or the other of the first two steps should be performed. Furthermore, with respect to the lowering of the compressive stress of the intermediate layer, the compressive/tensile stress on the intermediate layer should be adjusted, as discussed above, as much as possible without increasing tensile stress sufficiently to result in die cracking.

The amount of adjustment of the compressive stress of the silicon nitride layer should, therefore, be insufficient to measurably increase the penetration of moisture or ion contaminates through the layer. Thus, the change in reaction conditions resulting in lowering of the compressive stress of the silicon nitride layer, e.g., raising the pressure in the PECVD system used to form the silicon nitride layer, should only be made sufficiently to result in the elimination of voids in the metal layer, and such process adjustments should only be done after at least one of the other steps has been carried out to avoid an excessive loss of compressive stress in the silicon nitride layer and resultant loss of moisture and ion penetration resistance. When the invention is practiced in connection with the encapsulation of EPROM devices, the amount of decrease in the compressive stress of the silicon nitride layer should also be insufficient to interfere with the transparency of the silicon nitride layer.

It is recognized that the practice of this invention may, therefore, require the use of some empirical determinations since there will be an interrelationship between the steps. However, the desired end result, namely the elimination of voids in the metal layer induced by transmission of the compressive stress of the silicon nitride layer to the metal layer, is easily determined in the final product by microscopic techniques. Thus one skilled in the art, given the foregoing discussing of parameters, as well as the hierarchical order of treatments, will be able to practice this invention and achieve the desired elimination of voids in the metal layer.

It should be noted, in this regard, that when the invention is practiced in connection with the formation of an EPROM type integrated circuit structure, it is the intent that this invention be practiced in combination with the process described and claimed in the aforementioned Forouhi et al '541 patent, particularly with regard to the use of amounts of silicon insufficient to result in the formation of silicon-silicon bonds. While the change in reaction parameters to lower the compressive stress of the silicon nitride layer, such as the use of higher pressures, can have deleterious effects on the moisture and ion penetration resistance of the silicon nitride layer; high pressure may result in excess silicon which can also have a deleterious effect on the UV transparency of the resulting silicon nitride layer.

While we do not intend to be bound by any theories of the mechanisms involved in the formation of transparent layers of silicon nitride, the effects of both high pressure and excess silicon atoms are thought to promote the formation of silicon-silicon bonds, rather than silicon-nitrogen bonds, which silicon-silicon bonds are thought to contribute to the opacity of conventional silicon nitride layers. In fact, it is further postulated that the reason for the increased transparency of silicon oxynitride layers may be due to the added retardation of silicon-silicon bond formation by the presence of oxygen with which the silicon atoms will bond in preference to other silicon atoms.

To further illustrate the invention, an integrated. circuit structure having a patterned aluminum layer thereon was subject to an argon implantation at an energy level of 70 keV at ambient temperature to provide an implantation of about $5 \times 10^{15}$ ions/cm$^2$ to a depth of about 750 Å in the aluminum surface.

A silicon oxynitride layer of about 1.35 micron thickness was then formed over the implanted aluminum layer in a plasma enhanced chemical vacuum deposition (PECVD) apparatus comprising a 1500 watt ASM Micon V plasma deposition reactor and using a duty cycle of 30 milliseconds on and 300 milliseconds off. The reactants comprised a mixture of 400 SCCM silane (SiH$_4$), 3000 SCCM NH$_3$, and 2000 SCCM N$_2$O and were flowed over the structure in a vacuum chamber maintained at 380° C. and a pressure of 1.6 Torr to provide a deposition rate of about 200 Å/minute. The deposition was carried out for 68 minutes to yield a silicon oxynitride layer having a tensile stress of $5 \times 10^8$ dynes/cm$^2$ as measured with an IONIC stress gauge.

A silicon nitride layer transparent to UV radiation at 2537 Å was then formed over the silicon oxynitride layer using the process of the Forouhi et al '541 patent modified somewhat to reduce the compressive stress in the silicon nitride layer using the same type of plasma enhanced chemical vacuum deposition (PECVD) apparatus as used to form the silicon oxynitride layer, i.e., a 1500 watt ASM Micon V plasma deposition reactor using a duty cycle of 30 milliseconds on and 300 milliseconds off. A gas flow of 300 SCCM silane to 5300 SCCM ammonia was used at a temperature of about 380° C. and a pressure of about 2.0 Torr. The PECVD deposition was carried out for about 105 minutes to form a silicon nitride layer of about 1.35 micron thickness having a compressive stress of $5 \times 10^9$ dynes/cm$^2$ as measured with an IONIC stress gauge.

After applying the silicon oxynitride and silicon nitride layers, the integrated circuit structure was visually examined under a microscope for voids. None were seen. The structure was then placed in a furnace and heated to 400° C. and maintained at this temperature for 20 minutes in a nitrogen atmosphere. The structure was removed from the furnace and again examined under a microscope. Again no voids were noted. The structure was then completed and placed in an oven and heated to 200° C. and held at this temperature for 20 hours in a nitrogen atmosphere. The structure was removed from the oven and again examined for voids under a microscope. No voids were found in the aluminum portion examined.

Thus, the invention provides a method for the production of an integrated circuit structure encapsulated by a silicon nitride layer to provide excellent resistance to moisture and ion penetration while providing sufficient stress relief in and adjacent the underlying metal layer to prevent the formation of undesirable voids in the underlying metal layer.

Having thus described the invention, what is claimed is:

1. A method for producing an integrated circuit structure encapsulated in a layer of silicon nitride to provide resistance to penetration by moisture and ion contaminants and further characterized by a substantial absence of observable voids in an underlying metal layer which comprises a portion of said integrated circuit structure, said method comprising the step of: stress relieving the underlying metal layer from stresses induced by the compressive stress of said silicon nitride encapsulating layer by implanting the metal surface of said metal layer, before encapsulating said structure with said silicon nitride layer, with ions to change the grain structure adjacent the surface of said metal layer.

2. The method of claim 1 wherein said step of reducing the compressive stress in said silicon nitride layer further comprises lowering said compressive stress by maintaining, during formation of said silicon nitride layer, a pressure in the reactor high enough to maintain sufficient compressive stress to provide resistance to penetration by moisture and ion contaminants without resulting in the formation of ascertainable voids in said metal layer.

3. The method of claim 2 wherein said integrated circuit structure is an EPROM and said step of reducing the compressive stress in said silicon nitride layer in an amount sufficient, in combination with said implantation step, to eliminate the formation of acertainable voids in said metal layer while still maintaining sufficient compressive stress in said silicon nitride layer to provide resistance to penetration by moisture and ion contaminants comprises forming said silicon nitride layer while maintaining a pressure in the reactor high enough to maintain sufficient compressive stress to provide resistance to penetration by moisture and ion contaminants without resulting in the formation of acertainable voids in said metal layer and to maintain sufficient Uv transparency in said silicon nitride layer to permit erasure of said EPROM in less than one hour at 0.02 to 0.03 watts/cm$^2$ intensity.

4. The method of claim 1 wherein said stress relief of said metal layer is accomplished by the steps of:
   (a) implanting the metal surface of said metal layer with ions to change the grain structure adjacent the surface of said metal layer; and
   (b) forming an intermediate stress-relieving layer between said metal layer and said silicon nitride encapsulating layer;
to eliminate the formation of ascertainable voids in said metal layer while still maintaining sufficient compressive stress in said silicon nitride layer to provide resistance to penetration by moisture and ion contaminants.

5. The method of claim 1 wherein said stress relief of said metal layer is accomplishing by the stress of:
   (a) forming an intermediate stress-relieving layer between said metal layer and said silicon nitride encapsulating layer; and
   (b) reducing the compressive stress in said silicon nitride layer in an amount sufficient to eliminate the formation of ascertainable voids in said metal layer while still maintaining sufficient compressive stress in said silicon nitride layer to provide resistance to penetration by moisture and ion contaminants.

6. A method for producing an integrated circuit structure having improved resistance to penetration by moisture and ion contaminants and a substantial absence, in an underlying metal layer comprising a portion of said integrated circuit structure, of voids visible under a microscope, by stress relief of said metal layer from stresses induced by the compressive stress of a silicon nitride encapsulating layer which comprises the steps of:
   (a) implanting, to a depth of from about 150 to 2500Å, the metal surface of said metal layer, before encapsulating said structure with said silicon nitride layer, with ions at an energy level of from about 40 KEV to about 200 KEV and a concentration of from about $10^{15}$ to about $10^{16}$ ions/cm$^2$ to change the grain structure adjacent the surface of said metal layer; and (b) reducing the compressive stress in said silicon nitride layer to not less than $2.5 \times 10^9$ dynes/cm$^2$ but sufficient, in combination with said implantation step, to eliminate the formation of voids visible under a microscope in said metal layer while still maintaining sufficient compressive stress in said silicon nitride layer to provide resistance to penetration by moisture and ion contaminants.

7. A method for producing an integrated circuit structure having improved resistance to penetration by moisture and ion contaminants and a substantial absence, in an underlying metal layer comprising a portion of said integrated circuit structure, of voids visible under a microscope, by stress relief of said metal layer from stresses induced by the compressive stress of a silicon nitride encapsulating layer which comprises the steps of:

(a) implanting, to a depth of from about 150 to 2500Å, the metal surface of said metal layer, before encapsulating said structure with said silicon nitride layer, with ions at an energy level of from about 40 KEV to about 200 KEV and a concentration of from about $10^{15}$ to about $10^{16}$ ions/cm$^2$ to change the grain structure adjacent the surface of said metal layer; and (b) forming an intermediate stress-relieving layer between said metal layer and said silicon nitride encapsulating layer selected from the class consisting of silicon oxide and silicon oxynitride;

to eliminate the formation of voids visible under a microscope in said metal layer while still maintaining sufficient compressive stress in said silicon nitride layer to provide resistance to penetration by moisture and ion contaminants.

8. The method of claim 7 wherein said step of forming said intermediate insulating layer further comprises forming an intermediate layer of silicon oxynitride by chemically vapor depositing a mixture of silane and one or more oxides of nitrogen on said metal layer while maintaining the concentration of said one or more oxides of nitrogen sufficiently high to lower the compressive stress in said silicon oxynitride layer to a level which will compensate for said compressive stress in the silicon nitride layer subsequently formed thereover to thereby inhibit formation of observable voids in said underlying metal layer.

9. The method of claim 8 wherein said stress relieving of said underlying metal layer further comprises reducing the compressive stress in said silicon nitride layer by forming said silicon nitride layer in a reactor while maintaining a pressure in said reactor sufficient to provide a compressive stress in said silicon nitride layer of not less than $2.5 \times 10^9$ dynes/cm$^2$.

10. The method of claim 1 wherein said step of stress relieving said underlying metal layer further comprises the steps of:

(a) implanting the metal surface of said metal layer, before encapsulating said structure with said silicon nitride layer, with ions to change the grain structure adjacent the surface of said metal layer by implanting, at an energy level of from about 40 kEV to about 200 kEV, ions selected from the class consisting of ions of argon, arsenic, boron, neon, krypton, silicon, by bombarding said metal layer with said ions at a concentration of from about $10^{15}$ to about $10^{16}$ ions/cm$^2$ to implant said ions into the surface of said metal layer to a depth of from about 150 to 2500Å;

(b) forming an intermediate insulating layer consisting essentially of silicon oxynitride by chemically vapor depositing a mixture of silane and one or more oxides of nitrogen on said metal layer; and (c) forming said silicon nitride layer in a reactor while maintaining a pressure in said reactor sufficient to provide a compressive stress in said silicon nitride layer of not less than $2.5 \times 10^9$ dynes/cm$^2$.

11. A method for producing an integrated circuit structure having excellent resistance to penetration by moisture and ion contaminants and a substantial absence of voids in the underlying metal layer comprising a portion of said integrated circuit structure by stress relieving the underlying metal layer from stresses induced by the compressive stress of a silicon nitride encapsulating layer sufficiently to inhibit the formation of voids in said metal layer by the steps of:

(a) implanting the metal surface of said metal layer with ions to change the grain structure adjacent the surface of said metal layer; and (b) reducing the compressive stress in said silicon nitride layer in an amount sufficient, in combination with said implantation step, to eliminate the formation of ascertainable voids in said metal layer while still maintaining sufficient compressive stress in said silicon nitride layer to provide resistance to penetration by moisture and ion contaminants.

12. The method of claim 11 wherein said step of stress relieving said metal layer further includes the step of reducing the compressive stress in said silicon nitride layer to not less than $2.5 \times 10^9$ dynes/cm$^2$.

13. The method of claim 11 wherein said ion implantation step comprises implantation of ions into the surface of said metal to a depth of from about 150 to 2500Å.

14. The method of claim 13 wherein said ion implantation step comprises implanting from about $10^{15}$ to about $10^{16}$ ions/cm$^2$ into the surface of said metal layer.

15. The system of claim 14 wherein said ion implantation step further comprised implanting said ions at an energy level of from about 40 kEV to about 200 kEV.

16. The method of claim 15 wherein said ion implantation step further comprises implanting ions selected from the class consisting of ions of argon, arsenic, boron, neon, krypton, silicon, and the metal being bombarded.

17. The system of claim 15 wherein said ion implantation step further comprises implanting argon ions into the surface of said metal layer.

18. A method for producing an integrated circuit structure having excellent resistance to penetration by moisture and ion contaminants and a substantial absence of voids in the underlying metal layer comprising a portion of said integrated circuit structure by stress relieving the underlying metal layer from stresses induced by the compressive stress of a silicon nitride encapsulating layer sufficiently to inhibit the formation of voids in said metal layer by the steps of:

(a) implanting the metal surface of said metal layer with ions to change the grain structure adjacent the surface of said metal layer; and (b) forming an intermediate stress-relieving layer between said metal layer and said silicon nitride encapsulating layer;

to eliminate the formation of ascertainable voids in said metal layer while still maintaining sufficient compressive stress in said silicon nitride layer to provide resistance to penetration by moisture and ion contaminants.

19. The method of claim 18 wherein said step of forming an intermediate stress-relieving layer further comprises forming an intermediate layer consisting essentially of a silicon oxide.

20. The method of claim 18 wherein said step of forming an intermediate insulating layer further comprises forming an intermediate insulating layer consisting essentially of silicon oxynitride.

21. The method of claim 20 wherein said step of forming said intermediate insulating layer consisting essentially of silicon oxynitride further comprises chemically vapor depositing a mixture of silane and one or more oxides of nitrogen on said metal layer while maintaining a pressure sufficiently high to compensate for said compressive stress in the silicon nitride layer subsequently formed thereover to inhibit formation of ascertainable voids in said underlying metal layer.

22. The method of claim 20 wherein said step of forming said intermediate insulating layer consisting essentially of silicon oxynitride further comprises chemically vapor depositing a mixture of silane and one or more oxides of nitrogen on said metal layer while maintaining the concentration of said one or more oxides of nitrogen sufficiently high to lower the compressive stress in said silicon oxynitride layer to a level which will compensate for said compressive stress in the silicon nitride layer subsequently formed thereover to thereby inhibit formation of ascertainable voids in said underlying metal layer.

23. The method of claim 21 including the further step of reducing the compressive stress in said silicon nitride layer in an amount sufficient, in combination with said step of forming said intermediate layer, to eliminate the formation of ascertainable voids in said metal layer while still maintaining sufficient compressive stress in said silicon nitride layer to provide resistance to penetration by moisture and ion contaminants.

24. The method of claim 23 wherein said step of reducing the compressive stress in said silicon nitride comprises lowering said compressive stress of said silicon nitride layer to not less than $2.5 \times 10^9$ dynes/cm$^2$.

25. The method of claim 18 wherein said step of reducing the compressive stress in said silicon nitride comprises lowering said compressive stress of said silicon nitride layer to not less than $2.5 \times 10^9$ dynes/cm$^2$.

26. A method for producing an integrated circuit structure having excellent resistance to penetration by moisture and ion contaminants and a substantial absence of ascertainable voids in an underlying metal layer comprising a portion of said integrated circuit structure which comprises stress relieving the underlying metal layer from stresses induced by the compressive stress of a silicon nitride encapsulating layer by the steps of:

(a) implanting the metal surface of said metal layer with ions to change the grain structure adjacent the surface of said metal layer;

(b) forming an insulating intermediate layer between said metal layer and said silicon nitride layer selected from the class consisting of an oxide of silicon and silicon oxynitride having a compressive/tensile stress which sufficiently compensates for the compressive stress of said silicon nitride layer to inhibit the formation of ascertainable voids in said metal layer; and (c) controlling the compressive stress of said silicon nitride layer during formation of said layer by chemical vapor deposition of silane and ammonia to provide sufficient compressive stress to provide resistance to penetration by moisture and ion contaminants superior to silicon dioxide or silicon oxynitride layers of similar thickness while inhibiting, in combination with said intermediate layer, the inducement of sufficient stress in said metal layer to cause the formation of ascertainable voids in said metal layer.

27. A method for producing an erasable programmable read only memory type integrated circuit structure having excellent resistance to penetration by moisture and ion contaminants and a substantial absence of ascertainable voids in an underlying metal layer comprising a portion of said integrated circuit structure which comprises stress relieving the underlying metal layer from stresses induced by the compressive stress of a UV light-transparent silicon nitride encapsulating layer by the steps of:

(a) implanting the metal surface of said metal layer with ions to change the grain structure adjacent the surface of said metal layer;

(b) forming a UV light-transparent insulating intermediate layer between said metal layer and said silicon nitride layer selected from the class consisting of an oxide of silicon and silicon oxynitride having a compressive/tensile stress which sufficiently compensates for the compressive stress of said silicon nitride layer to inhibit the formation of ascertainable voids in said metal layer; and (c) controlling the compressive stress of said silicon nitride layer formed by chemical vapor deposition of silane and ammonia to provide a compressive stress of at least $2.5 \times 10^9$ dynes/cm$^2$ to provide resistance to penetration by moisture and ion contaminants superior to silicon dioxide or silicon oxynitride layers of similar thickness while maintaining said UV light transparency of said silicon nitride layer and while inhibiting, in combination with said intermediate layer, the inducement of sufficient stress in said metal layer to cause the formation of ascertainable voids in said metal layer.

28. A method for producing an integrated circuit structure encapsulated in a layer of silicon nitride to provide resistance to penetration by moisture and ion contaminants and further characterized by a substantial absence of observable voids in an underlying metal layer which comprises a portion of said integrated circuit structure, said method comprising:

stress relieving said underlying metal layer from stresses induced by the compressive stress of said silicon nitride encapsulating layer to inhibit the formation of observable voids in said metal layer by the following steps:

(a) implanting the metal surface of said metal layer, before encapsulating said structure with said silicon nitride layer, with ions to change the grain structure adjacent the surface of said metal layer by implanting, at an energy level of from about 40 kEV to about 200 kEV, ions selected from the class consisting of ions of argon, arsenic, boron, neon, krypton, silicon, by bombarding said metal layer with said ions at a concentration of from about $10^{15}$ to about $10^{16}$ ions/cm$^2$ to implant said ions into the surface of said metal layer to a depth of from about 150 to 2500Å;

(b) forming an intermediate insulating layer consisting essentially of silicon oxynitride by chemically vapor depositing a mixture of silane and one or more oxides of nitrogen on said metal layer; and (c) forming said silicon nitride layer in a reactor while maintaining a pressure in said reactor sufficient to provide a compressive stress in said silicon nitride layer of not less than $2.5 \times 10^9$ dynes/cm$^2$.

29. A method for producing an integrated circuit structure having improved resistance to penetration by moisture and ion contaminants and a substantial absence, in an underlying metal layer comprising a portion of said integrated circuit structure, of voids visible under a microscope, by stress relief of said metal layer from stresses induced by the compressive stress of a silicon nitride encapsulating layer which comprises the steps of:

(a) implanting, to a depth of from about 150 to 2500Å, the metal surface of said metal layer, before encapsulating said structure with said silicon nitride layer, with ions at an energy level of from about 40 KEV to about 200 KEV and a concentration of from about $10^{15}$ to about $10^{16}$ ions/cm$^2$ to change the grain structure adjacent the surface of said metal layer; and (b) reducing the compressive stress in said silicon nitride layer to not less than $2.5 \times 10^9$ dynes/cm$^2$ but sufficient, in combination with said implantation step, to eliminate the formation of voids visible under a microscope in said metal layer while still maintaining sufficient compressive stress in said silicon nitride layer to provide resistance to penetration by moisture and ion contaminants.

30. A method for producing an integrated circuit structure having improved resistance to penetration by moisture and ion contaminants and a substantial absence, in an underlying metal layer comprising a portion of said integrated circuit structure, of voids visible under a microscope, by stress relief of said metal layer from stresses induced by the compressive stress of a silicon nitride encapsulating layer which comprises the steps of:

(a) implanting, to a depth of from about 150 to 2500Å, the metal surface of said metal layer, before encapsulating said structure with said silicon nitride layer, with ions at an energy level of from about 40 KEV to about 200 KEV and a concentration of from about $10^{15}$ to about $10^{16}$ ions/cm$^2$ to change the grain structure adjacent the surface of said metal layer; and (b) forming an intermediate stress-relieving layer between said metal layer and said silicon nitride encapsulating layer selected from the class consisting of silicon oxide and silicon oxynitride;

to eliminate the formation of voids visible under a microscope in said metal layer while still maintaining sufficient compressive stress in said silicon nitride layer to provide resistance to penetration by moisture and ion contaminants.

* * * * *